United States Patent [19]

Pulvari

[11] 4,250,384
[45] Feb. 10, 1981

[54] RADIANT ENERGY SYSTEMS, MEMORIES AND THERMAL IMAGING METHODS AND APPARATUS

[76] Inventor: Charles F. Pulvari, 2014 Taylor St., NE., Washington, D.C. 20018

[21] Appl. No.: 69,477

[22] Filed: Aug. 24, 1979

[51] Int. Cl.³ .................... H01J 31/02; H01J 35/00
[52] U.S. Cl. .................... 250/330; 136/206; 136/213; 136/214; 250/338
[58] Field of Search .................... 136/206, 213, 214; 250/330, 338; 252/629; 307/401; 322/2 R

[56] References Cited

U.S. PATENT DOCUMENTS

| 3,243,687 | 3/1966 | Hoh .................... 136/213 X |
| 3,256,435 | 7/1966 | Astheimer .................... 136/213 X |
| 3,769,096 | 10/1973 | Ashkin et al. .................... 136/213 |
| 4,110,616 | 8/1978 | Porter et al. .................... 250/332 |
| 4,147,562 | 4/1979 | Chiang et al. .................... 136/213 |

*Primary Examiner*—Leland A. Sebastian
*Attorney, Agent, or Firm*—Jim Zegeer

[57] ABSTRACT

A very thin insulator having a dipole structure such as a dielectric material having ferroelectric properties and, preferably, also having thermodielectric properties, is used as the insulator insulating an electrode of an electrode pair from a semiconductor body sandwiched between said electrode pair. The utilization of the charge storage and transfer ability serves as a large scale memory device. Radiation detection and solar energy conversion systems based on establishment of an inversion layer by the bound charge of thermodielectric layer or an electret and irradiation of the semiconductor to separate the electron-hole pair and subsequent collection of minority carriers. Since there is no physical junction, the voltage is high, and can be an alternating current voltage which can be transformed. In one embodiment the dielectric material exhibiting thermodielectric properties provides the bound charge and is used in a thermal imaging system. In such system a matrix or mosaic of charged thermodielectric capacitors biased to near the Curie temperature, are exposed to a source of infrared to be detected. Such mosaic of thermodielectric capacitors is used to convert the IR image to electrical signals.

23 Claims, 10 Drawing Figures

RADIANT ENERGY SYSTEMS, MEMORIES AND THERMAL IMAGING METHODS AND APPARATUS

BACKGROUND OF THE INVENTION

Various forms of solid state imaging, memory and energy conversion systems are known and used in the art with varying degrees of economy, efficiency and ease of manufactures, there being tradeoffs between each of these desirable goals. One form of energy conversion uses the thermodielectric effect to convert infrared radiation to electrical energy, as is disclosed in Hoh U.S. Pat. Nos. 3,073,974 and 3,243,687, incorporated herein by reference. The materials disclosed in the Hoh patents are in the class of ferroelectric energy converters which are very temperature dependent in the neighborhood of the ferroelectric Curie point so these materials can be used as thermal detectors in solid state infrared detectors and imaging systems. The metal-insulator-semiconductor (MIS) art is now well developed and infrared imaging systems using inversion mode operated MIS devices with charge coupled devices (CCD), wherein an inversion region or layer is created at the insulator-semiconductor interface into which photogenerated minority are collected are known, see the article by Andrew J. Steckl et al entitled "Application of Charge Coupled Devices to Infrared Detection and Imaging", published in the IEE publication "Charge Coupled Devices: Technology and Applications" copyrighted in 1977, and incorporated herein by reference.

The objects of the present invention include providing improved radient energy sensing systems, large scale electrical memories and imaging methods and apparatus. In achieving these objects, the present invention, in one preferred mode, utilizes a very thin ferroelectric material as the insulator of a MIS device. In another aspect of the invention, a very thin, low heat capacity ferroelectric material having thermodielectric properties is combined with a charge coupled device and serves as the retina of an infrared imaging device, and the charge coupled device can be a part of a MIS device. In still another and preferred aspect of the invention infrared energy is converted to electrical energy in a thin ferroelectric layer having thermodielectric properties, the thin ferroelectric layer constituting the insulator in a MIS device, the voltage produced by the thermodielectric conversion in the ferroelectric layer operates to create an inversion region or layer in the semiconductor body and a virtual PN junction. In such state, the utilization of the charge storage and transfer ability of an electroded polarized insulator (e.g. a ferroelectric body member having dipole structure) and semiconductor interface permits data to be stored and the device used as a large scale electronic memory.

BRIEF DESCRIPTION OF THE DRAWINGS

The above and other objects advantages and features of the invention will become more apparent when considered in conjunction with the accompanying drawings wherein.

Figure 1:
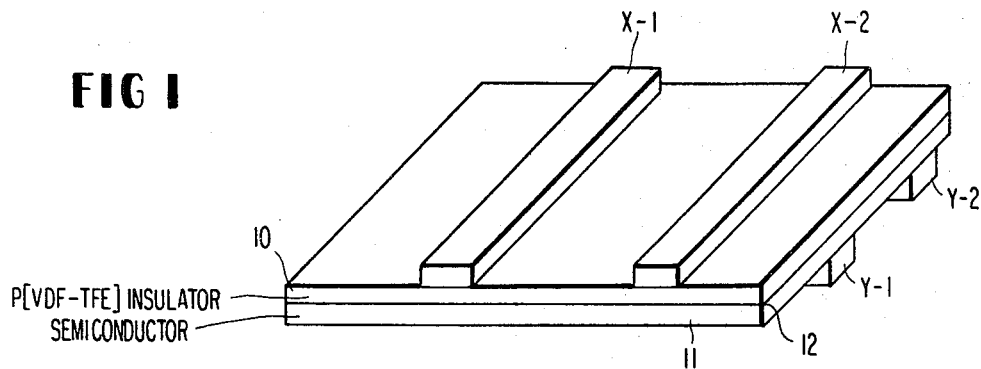
FIG. 1 is an isometric view of a radient energy device incorporating the invention.

With reference now to FIG. 1 of the drawings an infrared sensing device is shown wherein crossed conductor arrays x-1, x-2, x-n and y-1, y-2, and y-n form a matrix between which is sandwiched a thin insulating layer 10 constituted by a ferroelectric material which preferrably has thermodielectric properties and a thin semiconductor layer 11, the thin semiconductor layer being deposited, by vapor deposition on the ferroelectric layer to a few microns thick, for example. In the preferred embodiment, ferroelectric layer 10 is a copolymer P(VDF-TFE). In this embodiment, the X electrode array is first formed on a glass substrate (not shown) followed by insulator 10, semiconductor layer 11 and the Y electrode array.

Figure 2:
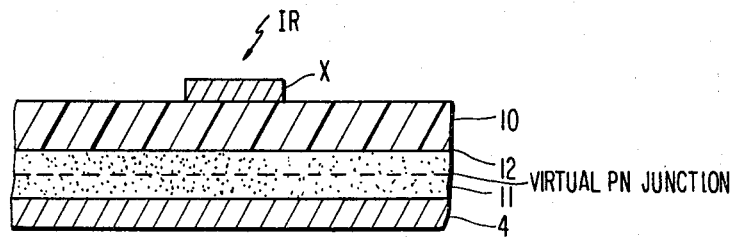
FIG. 2 is a cross-sectional view of a portion of the devices illustrated in FIG. 1.

FIG. 2 shows a portion of the IR sensing device described in FIG. 1. When illuminated by a thermal image a charge image is produced on the interface 12 of the polarized insulator (the ferroelectric polymer) and semiconductor. This charge pattern corresponds to the thermal image and produces an inversion layer in the semiconductor body 11, which in turn generates an inverted charge pattern and stores this until the sequentially and or parallel operating scanner drives it out to the output of the matrix. A scanning matrix electrode structure as described later herein, is indicated by x-1, x-2 on one side of the polarized insulator 10 and y-1, y-2 on the other side of the semiconductor 11.

It is this electron storage ability of the polarized insulator (ferroelectric) 10 and semiconductor interface 12, which can also be utilized as a memory i.e. information storage device. In this case, the charge pattern on the interface is not by a radiation pattern generated but the signals to be stored are through the scanning matrix electrodes - as symbolized in FIG. 1 (x-y) by X and Y - distributed over the whole ferroelectric - semiconductor interface 12. The scanning matrix electrodes are, in this case, energized in a coincidence fashion sequentially by the signal potentials to be stored and produced in the semiconductor inverted charge pockets under the selected X-Y crosspoints, which in total, produce and store said signal sequence or pattern until they come up for interrogation. The utilization of the charge storage and charge transfer ability of an electroded polarized insulator and semiconductor interface resembles in its operation to its magnetic counterpart: the bubble memory, and may enable to produce comparable memory devices.

Figure 3:
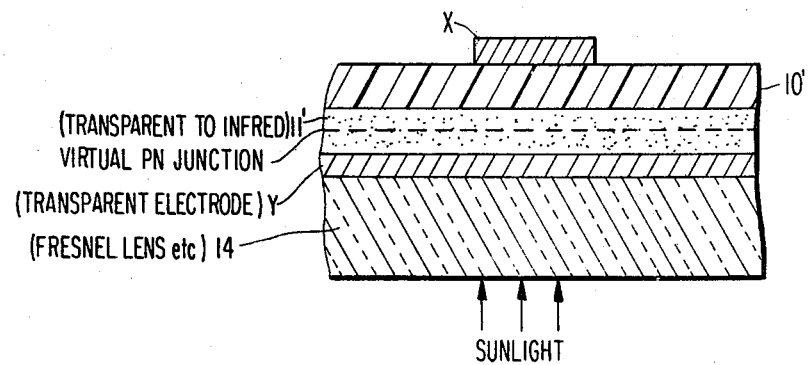
FIG. 3 illustrates modification.

FIG. 3 illustrates a modification wherein one electrode array (here designated "Y") is formed of transparent conductive electrode material such as tin oxide on a substrate 14, which could be glass or plastic and serves as a fresnel lens to focus light, such as sunlight, on the X electrode. Semiconductor layer 11 is transparent to infrared and is formed as a thin layer or film on the Y electrode array by epitaxial process. Ferroelectric layer 10" is the MIS insulating layer relative to electrode X".

This device is not energy gap limited and for radient energy conversion purposes converts a large portion of the spectrum of electromagnetic energy to electrical energy. Since it is an inversion mode operated device, there is no physical junction and the epitaxial layer can be extremely thin and the recombination effect is minimized.

PYROELECTRIC IMAGING

Pyroelectric vidicons have been the subject of increasing attention in France, England, Germany and the United States during the past few years, as they show promise in providing uncooled, low-cost infrared imaging systems as well as single element detectors, useful with either thermal (natural) radiation or laser sources. The basic properties of these devices have been amply described in the literature (2-6) (page 309 in the Ferroelectric 1976, Vol. 11, pps. 309-313). The present invention discloses a novel thermal (infrared IR) detection process i.e., device yielding smear-free thermal images with sustantially higher detectability.

The heretofore developed at room temperature operating IR imaging or detecting devices utilized the pyroelectric effect. When a polar crystal in which a spontaneous polarization Ps exists is heated or cooled, the internal or external electrical conduction generally cannot provide enough current to compensate for the change in polarization with temperature and the crystal develops an electric charge on its surface. For this reason, polar crystals of this type are called pyroelectric (Vol. 10. 1976, pages 83-89) (6,7). It was found that the practically most useful pyroelectrics are also ferroelectrics, and exhibit the pyroelectric property in the ferroelectric phase, below the Curie temperature. The pyroelectric coefficient p is described by the expression dP/dT which shows that in order to obtain a change of the polar state an amount of heat energy is required which is equivalent to the electrical energy by which dipoles are bound by the internal crystal field. Measurements show that the pyroelectric peak and the dielectric anomaly's peak occur at different temperatures. The pyroelectric coefficient's peak appears ahead of the dielectric constant peak with respect to the Curie temperature indicating that the pyroelectric effect occurs primarily in the ferroelectric state, for pyroelectricity can only exist where remanent polarization exist that is below the Curie temperature, while the dielectric peaks occur at the Curie temperature and for this reason the thermodielectric effect is strongest and is primarily most useful near the Curie temperature in the paraelectric state.

It is well known that the randomisation of ferroelectric dipoles requires considerable more thermal energy than the relaxation of dipoles beyond the Curie temperature in the higher symmetry paraelectric state, where remanent polarization Pr vanishes. In addition, ferroelectric phenomena are molecular affects and for these reasons imaging devices utilizing the pyroelectric effect are less sensitive than their counterpart using quantum electronic imaging.

There are a number of other technological difficulties with the pyroelectric process such as the requirement of (1) preparing ferroelectric crystalline targets in the thickness range of microns (2) preparing these thin crystalline targets from a single domain single crystal (3) to support and electrode these types of crystalline targets (4) obtaining smear-free thermal images

THERMODIELECTRIC IMAGING

Considering all the difficulties and problems, a novel approach according to this invention is proposed to thermal imaging in this disclosure, this will be referred to as the thermodielectric imaging process. As described in the above Hoh patents and the published literature thermal radiation such as infrared can be converted directly to electricity by heating a charged capacitor containing a dielectric whose permittivity changes with temperature. This dependance of the permittivity on temperature is known as the thermodielectric effect, and is defined by the expression $d\epsilon/dT$. As an example of numerous ferroelectrics exhibiting the thermodielectric effect, the material showing the preferred relationship between temperature and the relative dielectric constant is vinylidene fluoride and tetrafluoroethylene co-polymer P(VDF-TFe) which has ferroelectric properties and a Curie temperature at about 120 C. Other polymers and copolymers may have even better thermodielectric properties and a Curie temperature as low as 80° C., but at this time, the aforementioned and co-polymer appears to be one of the more promising for thermal imagings because its high peak value and thermodielectric co-efficient $\epsilon$. The decreasing branch of the dielectric constant peak in the paraelectric phase provides a thermodielectric constant of $d\epsilon/dt\ [(25° C.)] = 30/4-9.8 = 74° C^{-1}$.

Using this value it is possible to calculate an equivalent pyroelectric co-efficient using the well known relationship:

$$p = \frac{1}{A} \frac{dQ}{dt} = \frac{V\epsilon°}{d} \cdot \frac{d\epsilon}{dT} \tag{1}$$

assuming a poling field of 200 Volts, a target thickness of $d = 6 \times 10^{-4}$ cm. and $\epsilon @ 10^{-13}$ Farad $cm^{-1}$.

$$P = \frac{74 \cdot 200 \cdot 10^{-13}}{6 \times 10^{-4}} = \frac{14.8}{6} \cdot 10^{-6} cm^{-2} k^{-1}$$

$$p \simeq 2.5 \mu c/cm^2 k°$$

considering now the pyroelectric constant of a $PVF_2$ polymer with a pyroelectric (constant) of $P_{pyro} = 3nc/cm^2k^0$ it is apparent that thermodielectric equivalent just calculated is 1000 times larger than their pyroelectric constant of $PCF_2$.

The dielectric is initially brought to an operating point giving a high static permittivity, close to the peak of the $\epsilon = f(T)$ curve in the paraelectric region. Because the dielectric constant is a volume property, as an alternative it is possible to bring the operating point of the dielectric in the high permittivity region by using a high pressure, or elevated temperature since both effect volume properties of a material equally well. In addition, because Ferroelectrics are inherently piezoelectric, the application of a proper poling field can also induce a proper stress and for this reason could also facilitate the setting of a high permittivity operating point. For convenicence, these three methods of setting the proper operating point of the thermodielectric sensor or target could be alternately as well as jointly be used.

As used herein the phrase—bias to the Curie point or temperature includes (1) The application of a voltage pulse to a physically constrained dielectric body having piezoelectric properties so as to induce, by voltage pulses, a peak value in the dielectric constant of the dielectric body.

(2) The application of pressure to a dielectric body of sufficient magnitude to induce a peak value in the dielectric constant of the dielectric body.

(3) The application of heat to a dielectric body sufficient to raise the temperature to induce a peak value in the dielectric constant of the dielectric body.

(4) A combination of two or more of the above (voltage, pressure, heat) to induce a peak valve in the dielectric constant of a dielectric body.

A thermal radiation or image is projected on the capacitor, which could have a single or multi capacitor structure and the radient photon energy is absorbed by the capacitor, thereby changing the temperature of the sensor or producing a thermal image on the multicapacitor structure, whose dielectric permittivity or permittivities decrease correspondingly, causing the voltage on the open-circuited capacitor or capacitors to rise. The capacitor or multicapacitor structure is discharged through the load resistor on which this rising voltage constitutes the electrical signal corresponding to the thermal information signal. Finally the dielectric is allowed to cool to the initial operating temperature thus allowing the cycle to be repeated. The cycles per second give the frequency of the signal produced. This switching process is in practice, by electronic means performed automatically. The signals appearing on the load resistance $R_L$ can be read out by cathode ray means, a charge coupled scanning device or any other electronic means. The phenomenon being utilized in this novel thermal imaging process is not the pyroelectric effect but the thermodielectric effect characterized by the expression $d\epsilon/dT$ and can be utilized in producing a wide range of high sensitivity radiation detectors and for thermal imaging processes as well. The thermodielectric cycle consists of increasing the electrical energy of a charged dielectric of an electric capacitor by increasing its temperature by $\Delta T$ which in turn produces an increase of $\Delta E$ in the electric field. The thermodielectric converter acts like a dielectric amplifier which increases the produced signal significantly and this is the reason that the equivalent pyroelectric coefficient is unusually high and promises that its performance may become comparable to its quantum electronic counterpart with the very important advantage that it does not require cooling. The amount of electrical energy converted in one cycle by the thermodielectric system, is equal to the difference between the electrical work done by the system and the electrical work done on the system in one cycle. This energy $W_s$, called the net electrical signal output per cycle, is given by the electrical energy output, $W_c$ during the discharging step (step "c") minus the electrical energy input $W_a$, during the charging step (step "a") and the net electrical signal per cycle is $W_s = W_c - W_a$.

Figure 4:
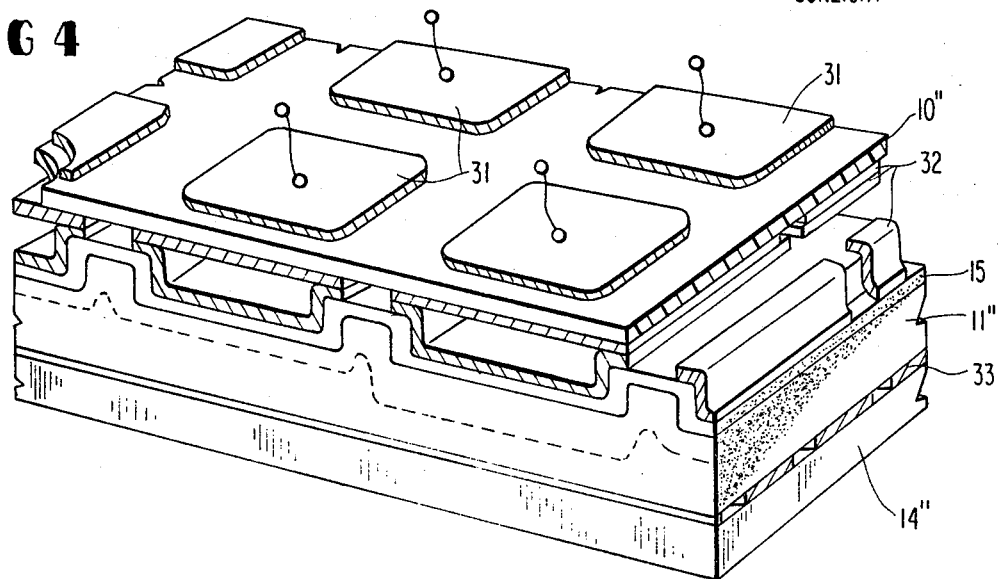
FIGS. 4 and 5 illustrate thermodielectric imaging systems incorporating the invention.
Figure 5:
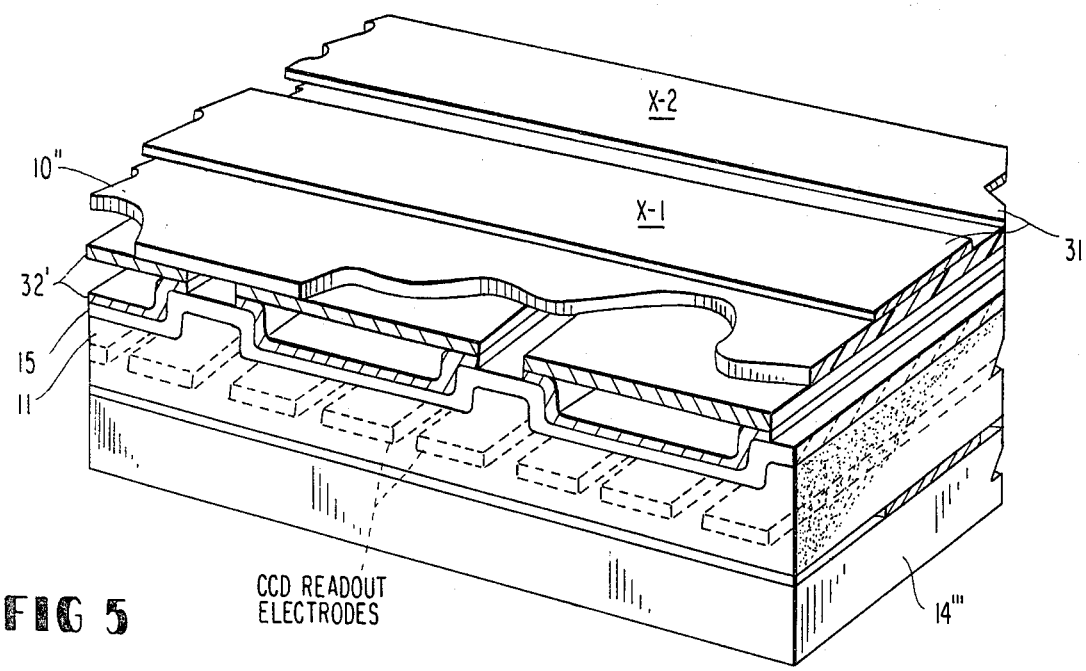
Figure 6:
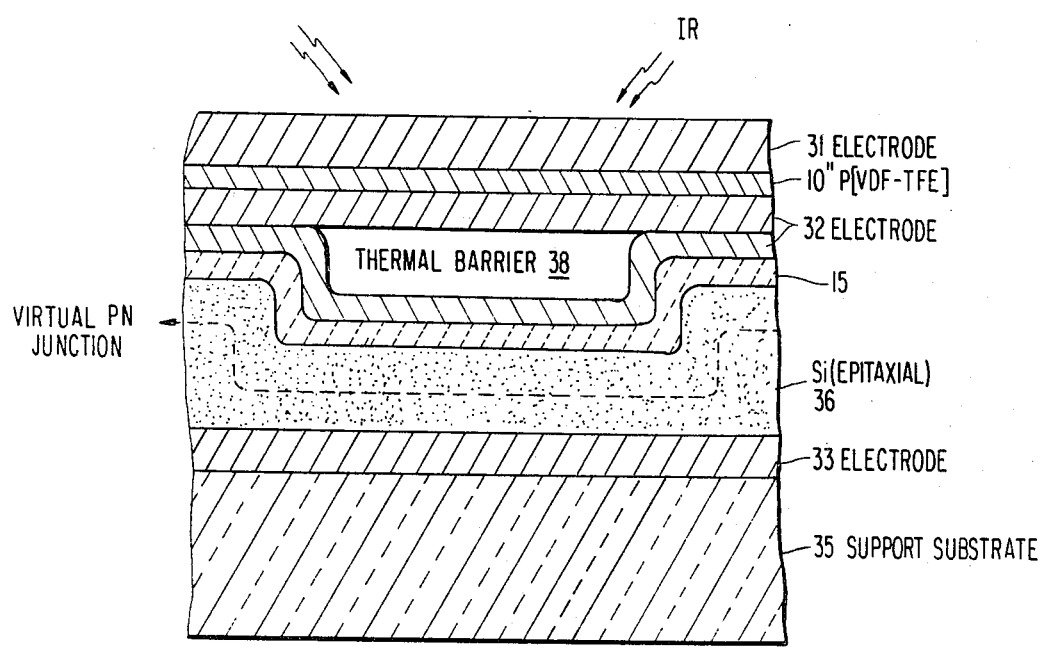
FIG. 6 is a partical sectional view of one element or pixel of the device.
Figure 10:
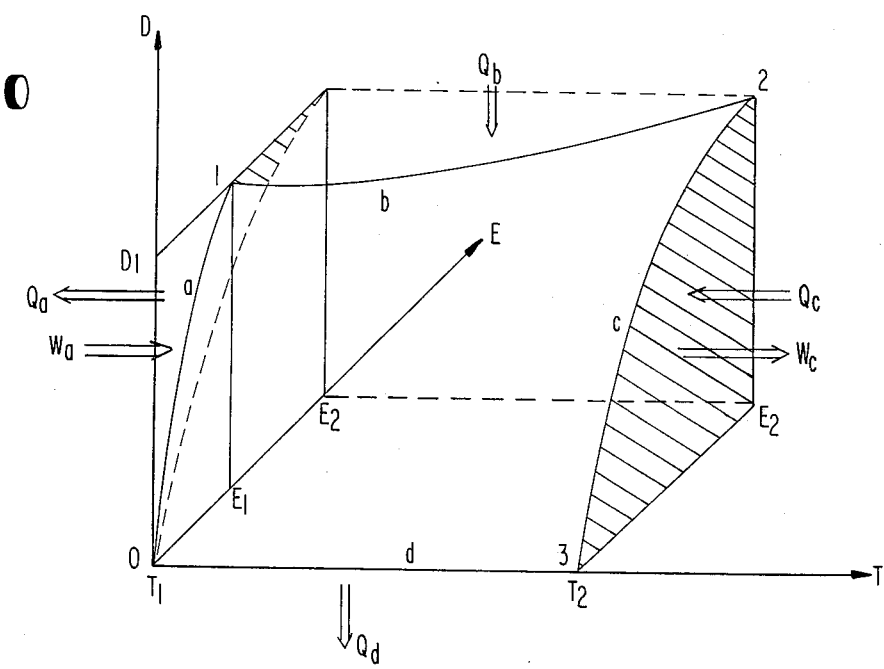
FIG. 10 illustrates the electrostic carnot conversion cycle for the thermodielectric material.

With reference to FIG. 10, the heat produced during the step "a", $Q_a$, is equal to the heat generated by the electrical work done on the capacitor to bring it from point "o" to the point "1" during charging. During step "b", heat is put into the dielectric (the thermal signal) which does not interchange any electrical energy with the outside. When the dielectric is discharged in step "c" electrical energy with an increased voltage is given up and heat is absorbed by it. During the cooling step (step "d") the heat rejected is $Q_d$ and this ends the cycle. (a more detail description of the cycle is found in Hoh U.S. Pat. No. 3,243,687). Although multicapacitor matrix scanners of any sort such as electromechanical, vidicon type or C.C.D. could all be employed for thermal imaging purposes, for illustration purposes the simplest of available imaging system module is presented in FIGS. 5 and 7. The reason for this choice is because the simple X-Y coincident voltage addressing read out technology lends itself more readily to the thermal imaging process utilizing the thermodielectric sensor retina (target). In the embodiment of FIGS. 4 and 6 the "X" electrodes are spot electrodes which can be scanned by an electromechanical scanner.

Figure 7:
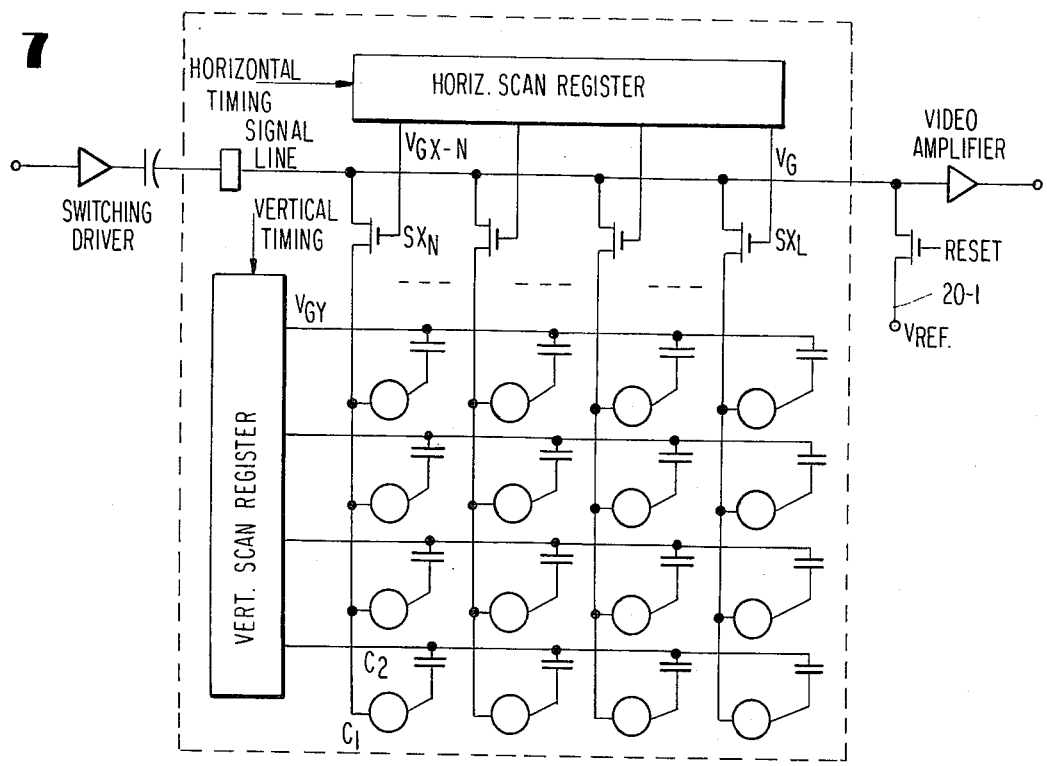
FIG. 7 is a schematic circuit diagram of a thermodielectric imaging system incorporating the invention and FIGS. 8 and 9 illustrate serial and parallel connections of the double capacitor elements.

As illustrated in FIG. 7, the thermal imager is a multicapacitor structure organized in an X-Y addressed array of sensor and charge storage capcitors. Each crosspoint of the transversely oriented X-Y electrode arrays is a sensing site or pixel, which accommodates two capacitors (effectively connected as in FIG. 8). One of these capacitors is the already described ferroelectric capacitor utilizing either the thermodielectric or pyroelectric phenomena and can be initially charged through reset switch 20 and the X set of the electrode arrays. The radiant photon energy of the image is absorbed by the sensor capacitors and the temperature changes in each of the capacitors of the multicapacitor structure accordingly and produces a thermal image. These ferroelectric thermodielectric capacitors convert the thermal energy into electrical energy as discussed earlier and the so generated charge coupled with the MIS capacitor attracts minority carriers in the inversion regions of the MIS capacitors each coupled with one of the ferroelectric capacitors such that they form a double capacitor in a sensing art.

DOUBLE CAPACITOR MATRIX

Figure 8:
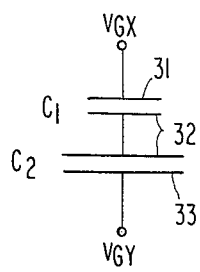
Figure 9:
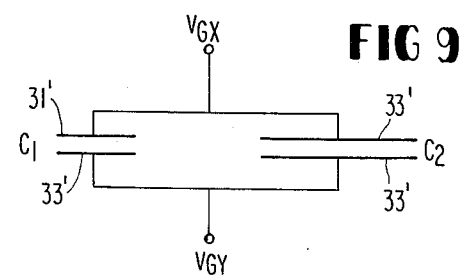

FIG. 8 is a schematic drawing of the double capacitor structure $C_1$ and $C_2$ which, while illustrated in the present embodiment as being electrically serially connected, could, advantageously, be connected electrically in parallel as shown in FIG. 9. $C_1$ is the ferroelectric thermodielectric capacitor and $C_2$ is the MIS capacitor. The two are in parallel (or series) and are in one sensing site pixel. It should be noted that the two capacitors could also be in parallel the choice would depend on the desired impedance level see FIG. 9. There are as many sensing sites or pixels as there are picture elements. In a practical device the capacitors are not separate and are arranged in an interconnected array. Referring to FIG. 4 the two electrodes of the ferroelectric thermodielectric capacitors are 31(the "X" electrode) and 32 and have, a dielectric 10' with thermodielectric properties, in this example, the copolymer P(VDF-TFE) is highly preferred. Capacitors $C_1$ and $C_2$ can be precharged by the application of a charging potential on the X arrays and as electrode 32 becomes negative with respect to electrode 33 (the "Y" electrical) and inversion layer is formed and electrode 32 collects minority carriers on the p Silicon and SiliconOxide ($SiO_2$) interface. In the embodiment shown in FIGS. 4 and 5 an insulating layer 15 of silicon oxide ($SiO_2$) is formed on the semiconductor layer 11 to insulate electrodes 32 from the P silicon body. In case of two parallel capacitors charging and the formation of inversion layer is similarly accomplished. When due to the projected thermal image, $C_1$'S temperature is changing, the potential of $C_1$ changes accordingly and more or less minority carriers are collected in the well, corresponding to the potential changes of electrode 32.

With reference to FIG. 6, the $C_2$ MIS capacitor is formed in the thin epitaxial Si layer (s) grown on substrate 35. On the interface of the epitaxial layer 36 and substrate 35 are the Y sets of the electrode arrays 33 buried, the other electrode 32 of the $C_2$ MIS capacitor is common with $C_1$ capacitor. The common electrode 32 has a novel structure due to the fact that it services two purposes: Capacitor $C_1$ absorbs the very weak thermal picture signals and in order to obtain the highest possible temperature change it is important to produce this capacitor of the smallest possible heat capacity. For this reason, electrode 31 and electrode 32 pertaining to $C_1$ are nearly transparent metal deposited types on the P (VDF-TFE) film, the thickness of which, in the preferred embodiment, is in the micron range, and is like a membrane mounted on the metalized dip electrode 32 prepared in an etched dip of the oxidized epitaxial layer 36 and serves as a collector for the incoming IR radiation. The object of this structure is to thermally isolate the thermodielectric membrane 37 and confine and retain the heat generated to the membrane constituted by the electroded polymer 10'' overlying thermal barrier 38. This metalized dip electrode 32 is actually the electrode 32' of the MIS capacitor $C_2$ and makes electrically conductive contact with the thin vapor deposited electrode 32 of the extremely thin thermodielectric capacitor $C_1$. The metalized dip electrode 32 and the thin electrode 32' on $C_1$ form a single electrode in ohmic conductive unity. Capacitors $C_1$ and $C_2$ could also be in a side by side configuration in this case electrode 33 could run on the surface of the oxidized epitaxial layer, and provide electrode 33 in direct contact with the expitaxial layer 36 and electrode 31 in proximity of $C_1$. As noted above, depending on the matrix the system could operate equally well with parallel connected capacitors $C_1$ and $C_2$, the driver circuitry being modified accordingly.

It should be noted that the radiation not absorbed by the ferroelectric thermodielectric capacitor will fall on the MIS capacitor and produce hole-electron pairs of large abundance because in absence of a physical junction, radiation having larger energies than the impurity energy levels will release i-e excite electron-hole (/e/-/h/) pairs, and the well caused by the inversion on the MIS interface will collect the minority carriers. This unique interaction of the ferroelectric and MIS capacitors results in highly sensitive and effective radiation conversion over nearly the whole radiation spectrum with no need of cooling and considerable higher signal levels than the conventional photodiode devices. For this reason this biased inversion layer structure senses nearly the whole radiation spectrum and is not energy gap limited as conventional junction devices are and extends its sensitivity far into the infrared. Because nearly 50% of solar energy is in the infrared, this was lost with photodiode type of conversion devices. The radiation conversion efficiency of this biased inversion layer well radiation detector is inherently higher than the photodiode type and hence constitutes a solar to electrical energy converter.

In order to provide a clean biasing and discharge, each electrode 32 may connect to MOSFET diffused in the epitaxial layer through which the proper conditions can be set, not shown in the drawings. Once the thermal image is received (established) and a corresponding electrical charge distribution is established on the thermodielectric retina, signal read out is accomplished by addressing sequentially all sites using a conventional X-Y coincident voltage technique or a CCD (the buried electrode illustrate the conventional three phase peristallic charge read-out and act in groups of three. (See the I.E.E. text cited above) of operation (see FIG. 5). The switching transients of the capacitors as they appear on the output load of the retina matrix represent the video signal. This signal can be detected anywhere in the loop composed of the substrate, driver circuit, and the driver array lines or on the end of each row line. The change in signal line voltage from its precharged level is proportional to the net thermal to electrical converted image signal.

Read out is monitored either point by point, i.e., capacitor by capacitor or line by line and the total area of the device is used for sensing i.e., collecting photons for a whole frame cycle thereby providing a high sensitivity charge coupled read out. However, it is clear that the concept of charge coupled read out may be adapted to the present invention, the read out disclosed herein being preferred.

The read out operation is simultaneously resetting (empty) the charge storage capacitors, and by recharging the capacitor sites they are ready for accepting the next frame. Recharging can be accomplished directly after read out and this gives every site a whole frame time for signal integration.

Since X-Y coincident voltage addressing is not unlike that used in digital ferroelectric capacitor memory matrices, and Prof. C. E. Pulvari has described various such ferroelectric memory matrix devices in a number of his inventions such as U.S. Pat. Nos. 3,476,951, 3,126,509; 2,918,655; 3,365,400; 2,884,617, all of which are incorporated herein by reference, additional description is not deemed necessary.

In addition, numerous other publications have discussed in detail C.C.D. readout, such as Charge-Coupled Devices Technology and Application IEEE Press page 186-192. 1978 Biennial Display Research Conference; IEEE, SID, and the Advisor Group of Electron Devices. Hence, it is not deemed necessary to describe again in detail the various matrix configurations, their biasing, sequential, parallel and random addressing modes, destructive, non destructive and signal processing read out modes etc.

As an example a schematic diagram of $Y \times Y$ thermal images is shown in FIG. 7 utilizing a ferroelectric thermoelectric image target. Briefly, the horizontal and vertical scan registers receive timing signals form a controller (not shown) which sequentially activates, by coincidence, of the individual elements or pixels located at the crossings of vertical conductors Vgx and the coupler switches $S_{x1} \ldots S_{xn}$ controlled thereby and horizontal conductors Vgy. The output signals are coupled, in serial order, as the scanning of the matrix progresses, to a video amplifier for application to a utilization device (not shown).

It will be appreciated that various modifications and changes will be obvious to those skilled in the art and such modifications and changes are intended to be encompassed in the spirit of the invention as defined in the claims.

I claim:

1. A radiant energy sensing element comprising a semiconductor capacitor having a semiconductor body member and at least one pair of electrodes and a second capacitor including a dielectric having a polarizable remanent dipole structure coupled to said semiconductor capacitor in such a way that an inversion layer is formed in said semiconductor body member, which when irradiated separates the electron /e/-hole/h/ pairs and collects the mobile carriers in the inversion layer.

2. The radiant energy sensing element defined in claim 1 wherein said second capacitor has thermodielectric properties.

3. A thermal imaging system comprising, a matrix of the radiant energy sensing elements defined in claim 2 and means for exposing said matrix to a thermal image, and means for scanning said elements to detect the portion of said thermal image at each of said elements, respectively.

4. Radiation detector comprising a semiconductor capacitor having a semiconductor body member and at least one pair of electrodes and a second capacitor coupled to said semiconductor capacitor in such a way that an inversion layer is formed in said semiconductor body member, which when irradiated generates the electron /e/-hole/h/ pairs and collects the mobile carriers in the depletion layer.

5. Radiation detector as defined in claim 4 characterized by a metal oxide semiconductor (MOS) capacitor with at least one pair of electrodes biased so as to establish said inversion layer.

6. Radiation detector as defined in claim 4 wherein one of the electrodes is transparent to the radiation to be detected.

7. Radiation detector as defined in claim 5 wherein said second capacitor include a ferroelectric pyroelectric capacitor interconnected with said MOS capacitor in such a way that when said MOS ferroelectric double capacitor is irradiated, the pyroelectric generated potential biases said MOS capacitor.

8. Radiation detector as defined in claim 5 wherein said bias source includes a ferroelectric thermodielectric capacitor interconnected with said MOS capacitor in such a way that when the MOS-ferroelectric double capacitor thus constituted is irradiated, the thermodielectrically generated potetital biases the MOS capacitor to produce said depletion layer.

9. Radiation detector as defined in claim 5 wherein said second capacitor is a ferroelectric capacitor and one of the electrodes on the ferroelectric capacitor is transparent to the radiation to be detected, and consists of two joint electrodes one of which is shared with said MOS capacitor while the other is shared with said ferroelectric capacitor.

10. Radiation detector as defined in claim 5 wherein said second capacitor is a ferroelectric capacitor and one of the electrodes of both said MOS capacitor and said ferroelectric capacitor is transparent to the radiation to be detected.

11. In a method of converting solar energy to electrical energy comprising establishing an inversion layer in a semiconductor body by applying a bias potential to a pair of electrodes one of which is insulated from said semiconductor body, subjecting said inversion layer to solar energy to generate the electron /e/—hole /h/ pairs, and collecting the minority carriers, the improvement wherein the bias potential applied to said pair of electrodes is generated in situ by solar to electrical energy conversion.

12. The invention defined in claim 11 wherein said bias potential is generated by a thermodielectric capacitor element.

13. The invention defined in claim 11 wherein said bias potential is generated by a pyroelectric capacitor element.

14. The invention defined in claim 11 wherein there is established a plurality (n) of said inversion layers in a common semiconductor body being subjected to a portion of the solar energy being converted to generate the electron-e/-hole/h/ pairs in each portion of the semiconductor commonly collecting said charge carriers from all said charged layers.

15. The invention defined in claim 14 wherein each of said inversion layers being formed by a MOS capacitor at the site of each semiconductor capacitor, generating a bias potential unique to each site by a further solar to electrical energy converter.

16. The invention defined in claim 15 wherein each said further solar to electrical energy converters is constituted by a thermodielectric capacitor element.

17. The invention defined in claim 14 wherein each step of commonly collecting said minority carriers includes scanning of each semiconductor capacitor and collecting the charge carriers at each capacitor site in said common semiconductor body.

18. A double capacitor comprising a pair of electrodes, a thin dielectric layer and a semiconductor body sandwiched between said pair of electrodes, said dielectric having ferroelectric properties and means for biasing said dielectric layer to near the Curie point thereof.

19. A thermal detector comprising
a pair of electrodes,
a layer of material having thermodielectric properties and a semiconductor layer sandwiched between said pair of electrodes,
means for biasing said layer of material having thermodielectric properties to near its Curie temperature,
voltage supply means for charging the electrodes and said dielectric to a selected potential,
means for exposing said layer to a source of thermal energy to be detected,
and readout means connected to said pair of electrodes.

20. An imaging system comprising
a pair of transversely oriented electrode arrays, at least one of said electrode array being transparent to radiant energy of a selected wave length (IR)
a dielectric means sandwiched between said electrode array, said dielectric means constituted of a dielectric having thermodielectric properties,
means for biasing said dielectric material to its Curie temperature,
means for applying a charging potential to said electrode arrays and said dielectric material,
means for projecting an energy image upon said dielectric material,
and readout means coupled to said electrode arrays for developing an electrical signal for each cross point of said array which is proportional to said energy image imaged upon said dielectric material at each cross point, respectively.

21. The invention defined in any one of claims 17-20 wherein said dielectric material is a plastic co-polymer.

22. The invention defined in claim 21 wherein said copolymer is P(VDF-TFE).

23. A night vision system comprising a pair of transversely oriented electrode arrays,
a thermodielectric material sandwiched between said electrode array, means for biasing said thermodielectric material to near its Curie temperature, means for applying a charging potential to said electrodes and said thermodielectric material, means for focusing a radiant energy image upon said thermodielectric material, and readout means coupled to said electrode arrays for developing an electrical signal for each cross point of said transversely oriented electrode arrays corresponding to the change in the thermal dielectric property of said thermal dielectric material due to the radiant energy impinging upon said dielectric material at each of the cross points of said transversely oriented electrode arrays, respectively.

* * * * *